(12) United States Patent
Cheng

(10) Patent No.: US 12,541,143 B2
(45) Date of Patent: Feb. 3, 2026

(54) FULLY REFLECTIVE PHASE-EDGE MASK FOR EUV LITHOGRAPHY

(71) Applicant: Taiwan Semiconductor Manufacturing Co., Ltd., Hsinchu (TW)

(72) Inventor: Wen-Hao Cheng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 318 days.

(21) Appl. No.: 17/026,645

(22) Filed: Sep. 21, 2020

(65) Prior Publication Data

US 2021/0302824 A1 Sep. 30, 2021

Related U.S. Application Data

(60) Provisional application No. 63/002,194, filed on Mar. 30, 2020.

(51) Int. Cl.
*G03F 1/24* (2012.01)
*G03F 1/52* (2012.01)

(52) U.S. Cl.
CPC . *G03F 1/24* (2013.01); *G03F 1/52* (2013.01)

(58) Field of Classification Search
CPC ...................... G03F 1/24; G03F 1/52
See application file for complete search history.

(56) References Cited

U.S. PATENT DOCUMENTS

| 8,980,108 | B1 | 3/2015 | Yu et al. | |
| 9,152,035 | B2 | 10/2015 | Yu et al. | |
| 9,274,417 | B2 | 3/2016 | Shih et al. | |
| 2003/0091910 | A1* | 5/2003 | Schwarzl | G03F 1/24 430/5 |
| 2005/0282072 | A1* | 12/2005 | Hector | G03F 1/32 430/394 |
| 2011/0287344 | A1* | 11/2011 | Irie | B82Y 10/00 430/5 |
| 2014/0051015 | A1* | 2/2014 | Gallagher | G03F 1/38 430/5 |
| 2015/0064611 | A1* | 3/2015 | Shih | G03F 1/24 430/5 |
| 2015/0116685 | A1* | 4/2015 | Lu | G03F 7/70091 355/71 |
| 2015/0282072 | A1 | 10/2015 | Glik et al. | |
| 2016/0238939 | A1* | 8/2016 | Brunner | G03F 7/2004 |
| 2019/0086791 | A1* | 3/2019 | Tanabe | G03F 1/24 |
| 2019/0324364 | A1 | 10/2019 | Hsu et al. | |
| 2020/0124957 | A1* | 4/2020 | Jaiswal | B82Y 40/00 |
| 2020/0124975 | A1* | 4/2020 | Lee | H05G 2/008 |

FOREIGN PATENT DOCUMENTS

CN 106353962 A 1/2017
CN 109960104 A 7/2019

* cited by examiner

*Primary Examiner* — Jonathan Johnson
*Assistant Examiner* — Jayson D Cosgrove
(74) *Attorney, Agent, or Firm* — Haynes and Boone, LLP

(57) ABSTRACT

A EUV lithography mask includes a substrate of a low thermal expansion material, a first reflective multilayer over the substrate, and a patterned reflective multilayer over the first reflective multilayer. The patterned reflective multilayer includes trenches through the patterned reflective multilayer. Each of the first reflective multilayer and the patterned reflective multilayer includes a stack of film pairs.

20 Claims, 17 Drawing Sheets

102

FULLY REFLECTIVE PHASE-EDGE MASK FOR EUV LITHOGRAPHY

PRIORITY

This claims benefits of and priority to the U.S. Provisional Application Ser. No. 63/002,194 filed Mar. 30, 2020, herein incorporated by reference in its entirety.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, extreme ultraviolet (EUV) lithography has been utilized to support critical dimension (CD) requirements of smaller devices. EUV lithography employs scanners using radiation in the EUV region, having a wavelength of about 1-100 nm. Some EUV scanners provide 4× reduction projection printing, similar to some optical scanners, except that the EUV scanners use reflective rather than refractive optics, e.g., mirrors instead of lenses. Masks used in EUV lithography present new challenges. For example, some EUV masks use a patterned absorber above a reflective multilayer (ML) where the absorber absorbs EUV light and the ML reflects EUV light, thereby creating a patterned EUV radiation for EUV lithograph. Patterning the absorber can be difficult due to stringent requirements for etching selectivity, sidewall profile, linearity, and so on. Further, the absorber causes some EUV energy loss during exposure, which lowers EUV wafer per hour (WPH) throughput. Still further, absorbing EUV lights heats up the EUV mask. For this reason, some EUV masks have to be taken offline sometimes for cooling, which further lowers EUV WPH throughput. Accordingly, although existing lithography methods have been generally adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
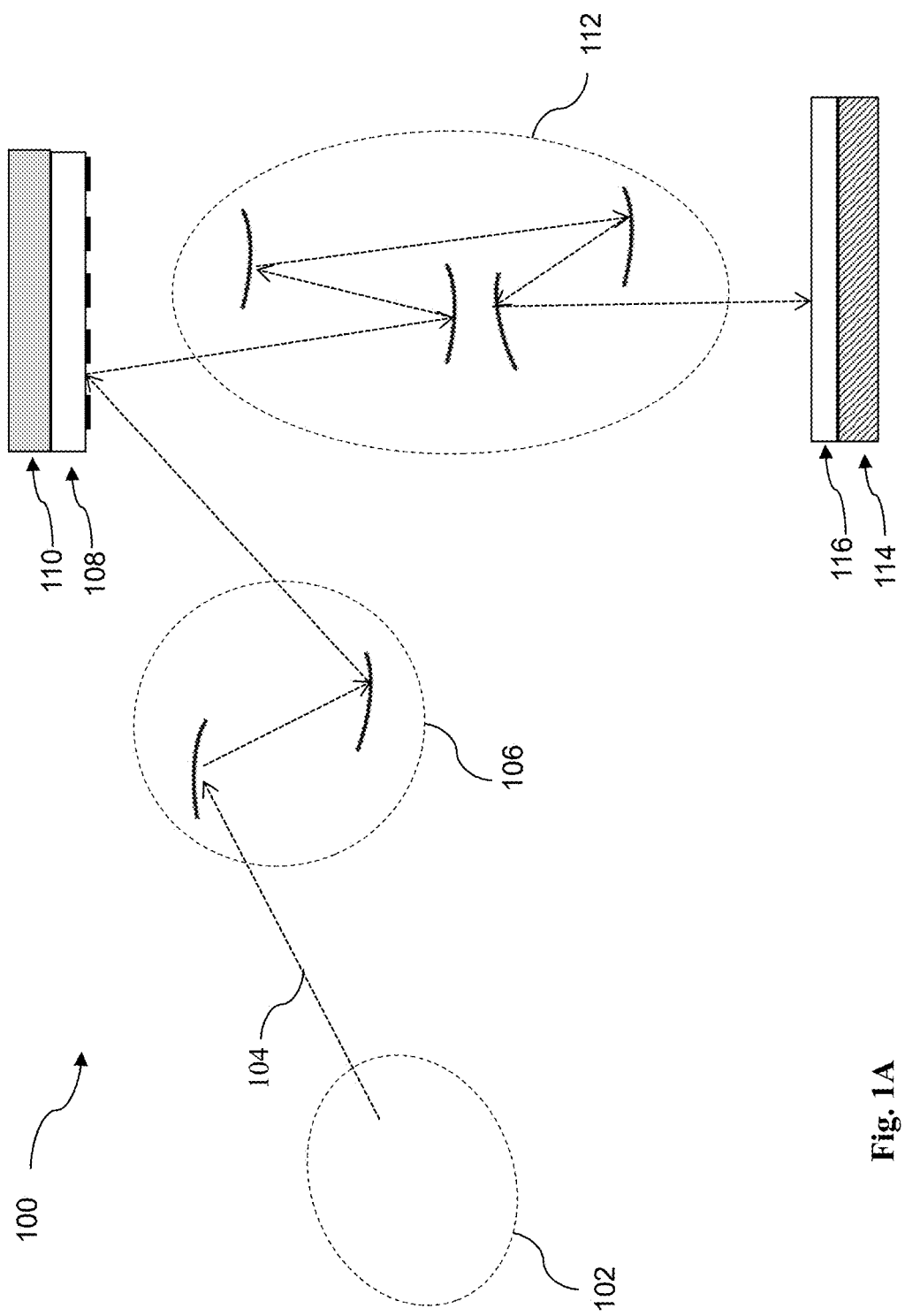
FIG. 1A is a diagram of an extreme ultraviolet (EUV) lithography exposing system that uses an EUV mask according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above." "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10%), or other number described in accordance with the knowledge of the skilled in the art in view of the specific technology disclosed herein, unless otherwise specified. For example, the term "about 5 nm" encompasses the dimension range from 4.5 nm to 5.5 nm, 4.0 nm to 5 nm, etc.

This application relates to a semiconductor fabrication process and the structure thereof, and more particularly to a novel EUV (extreme ultraviolet) mask. As discussed above, some EUV masks use a patterned absorber over a reflective multilayer (ML). This type of EUV mask is referred to as a binary EUV mask. There are issues related to the patterned absorber. For example, it is generally difficult to etch an absorber precisely to create ideal mask patterns. Also, an absorber induces extra EUV energy loss and extra heat to the EUV mask, both of which lower EUV WPH throughput. The general purposes of the present disclosure include making a new type of EUV masks without the patterned absorber. Instead, a reflective multilayer (ML) is patterned to create patterns (or ML patterns) for circuits, such as 1-dimensional line/space patterns, 2-dimensional hole patterns, or other patterns. The ML patterns may further be covered with a thin capping layer for protection. With this new type of EUV masks, the imaging contrast is modulated by phase edges (the edges of the ML patterns). Thus, this new type of EUV mask is referred to as Fully Reflective Phase-Edge Mask or FR-PEM. Experiments and simulations have shown that, with equivalent imaging performance as measured by contrast, ILS (Image Log Slope), NILS (Normalized ILS), and/or DoF (Depth of Focus), FR-PEM enables much higher WPH throughput than binary EUV masks. FR-PEM can also produce equal or better imaging performance than binary EUV masks. Thus, FR-PEM enables concurrent optimization of higher WPH Throughput and EUV lithographic imaging performance. The details of the method and device of the present disclosure are described by reference to the accompanied drawings.

FIG. 1A shows a EUV lithography system 100 that utilizes an FR-PEM according to one or more embodiments of the present disclosure for EUV lithography. The system 100 includes a radiation source 102 that produces a radiation beam 104, condenser optics 106, a mask 108 on a mask stage 110, projection optics 112, and a substrate 116 on a substrate stage 114. Other configurations and inclusion or omission of items may be possible. In the present disclosure, the system 100 may be a stepper or a scanner.

The radiation source 102 provides the radiation beam 104 having a wavelength in the EUV range, such as about 1 nm to about 100 nm. In an embodiment, the radiation beam 104 has a wavelength of about 13.5 nm. The condenser optics 106 includes a multilayer coated collector and a plurality of grazing mirrors. The condenser optics 106 is configured to collect and shape the radiation beam 104 and to provide a slit of the radiation beam 104 to the mask 108. The mask 108, also referred to as a photomask or a reticle, includes patterns of one or more target IC devices. The mask 108 provides a patterned aerial image to the radiation beam 104. In the present embodiment, the mask 108 is a reflective mask, particularly, a Fully Reflective Phase-Edge Mask or FR-PEM, which will be described in further detail below. So, it is also referred to as FR-PEM 108. The mask 108 may incorporate other resolution enhancement techniques such as optical proximity correction (OPC). The mask stage 110 secures the mask 108 thereon, such as by vacuum, and provides accurate position and movement of the mask 108 during alignment, focus, leveling and exposure operation in the EUV lithography system 100.

The projection optics 112 includes one or more lens and a plurality of mirrors. The lens may have a magnification of less than one thereby reducing the patterned aerial image of the mask 108 to the substrate 116. The substrate 116 includes a semiconductor wafer (or a wafer) with a photoresist (or resist) layer, which is sensitive to the radiation beam 104. The substrate 116 is secured by the substrate stage 114 which provides accurate position and movement of the substrate 116 during alignment, focus, leveling and exposing operation in the EUV lithography system 100 such that the patterned aerial image of the mask 108 is exposed onto the substrate 116 in a repetitive fashion (though other lithography methods are possible).

Figure 1C:
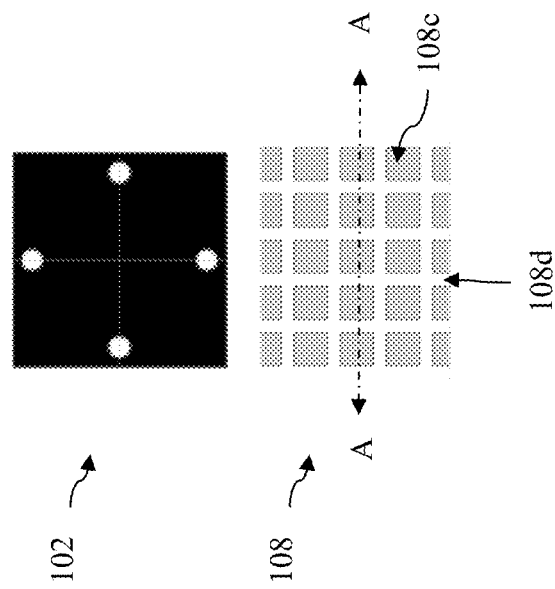
FIGS. 1B, 1C, and 1D illustrate light sources and target patterns that are used in the system of FIG. 1A, according to some embodiments.
Figure 1B:
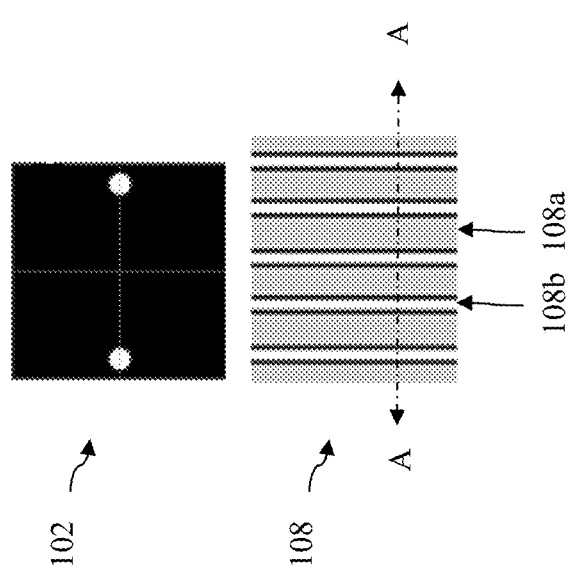
Figure 1D:
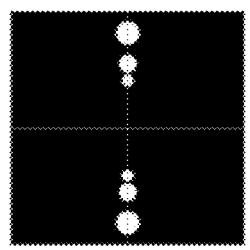

The radiation source 102 may include source pupils that are configured to match patterns in FR-PEM 108 in spatial frequency. For example, the radiation source 102 may include dipole illumination to match an FR-PEM 108 with 1-dimensional line/space patterns. An example of a dipole illumination source 102 is shown in FIG. 1B. Also shown in FIG. 1B is a top view of an FR-PEM 108 with line patterns 108a and spaces 108b alternating arranged. For another example, the radiation source 102 may include quadrupole illumination to match an FR-PEM 108 with 2-dimensional hole array patterns. An example of a quadrupole illumination source 102 is shown in FIG. 1C. Also shown in FIG. 1C is a top view of an FR-PEM 108 with an array of islands 108c separated by spaces 108d in rows and columns. It is noted that the top view of the FR-PEM 108 shown in FIGS. 1B and 1C may be about the same as a top view of a target pattern formed or to be formed in a resist layer on the substrate 116 taking into account the reduction factor in a lithography projection system (for example, a 4× reduction from a mask feature to a resist feature). For yet another example, the radiation source 102 may include hexapole illumination, an example of which is shown in FIG. 1D. Having a frequency matching source pupil has been shown to increase error tolerance in the ML patterns' etching depth variation on the mask 108. In some embodiments, the ML patterns (e.g., ML patterns 374 in FIGS. 2, 3, and 4) may vary +/−2 nm or +/−3 nm in heights and still achieve wafer image CD (critical dimension) variation about 0.3 nm and about 0.5 nm, respectively. Such CD variation is generally acceptable for a CD target, for example, of about 12.5 nm.

After the substrate 116 is exposed to the radiation beam 104, it is moved to a developer where areas of the photoresist layer of the substrate 116 are removed based on whether the area is exposed to the radiation beam 104, thereby transferring the patterns from the mask 108 to the substrate 116. In some embodiments, a developer includes a water-based developer, such as tetramethylammonium hydroxide (TMAH), for a positive tone development (PTD). In other embodiments, a developer may include an organic solvent or a mixture of organic solvents, such as methyl a-amyl ketone (MAK) or a mixture involving the MAK, for a negative tone development (NTD). Applying a developer includes spraying a developer on the exposed resist film, for example, by a spin-on process. Applying a developer also includes using a post exposure bake (PEB) process, a post developing bake (PDB) process, or a combination thereof. The developed or patterned photoresist layer is used for further processing the substrate 116 in order to form the target IC device. For example, one or more layers of the substrate 116 may be etched with the patterned photoresist layer as an etch mask to form circuit features.

Figure 2:
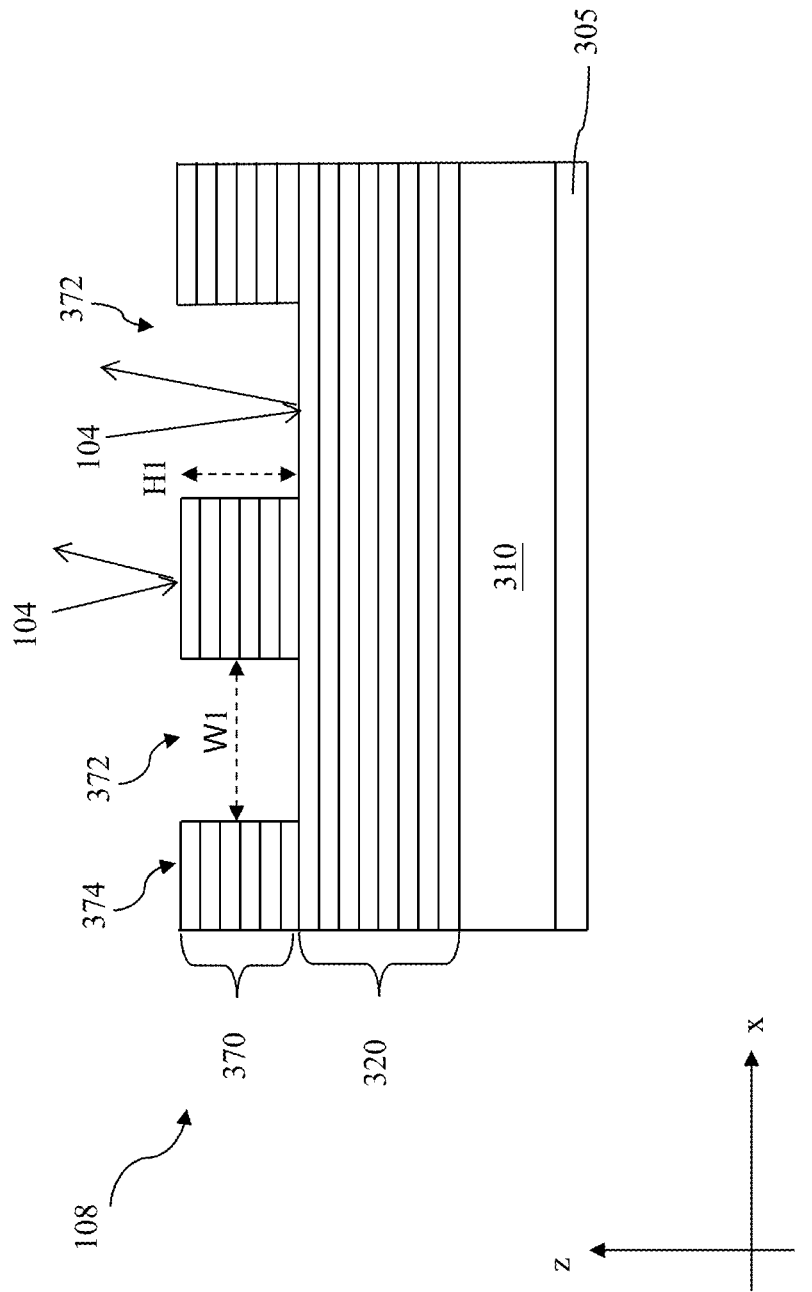
FIGS. 2, 3, and 4 illustrate cross-sectional views of embodiments of an EUV mask according to various aspects of the present disclosure.

FIG. 2 provides a cross-sectional view of the mask 108 taken along the A-A line of FIG. 1B or the A-A line of FIG. 1C. Referring to FIG. 2, the mask 108 includes a material layer 310, a reflective multilayer (ML) 320 disposed over the material layer 310, and a patterned ML 370 disposed over the reflective ML 320. In addition, a conductive layer 305 may be disposed under the material layer 310 for electrostatic chucking purposes in some embodiments. In an embodiment, the conductive layer 305 includes chromium nitride (CrN). In another embodiment, the conductive layer 305 includes tantalum boride (TaB) of about 60 nm to about 80 nm. Other configurations and inclusion or omission of various items in the mask 108 may be possible.

The material layer 310 includes a low thermal expansion material (LTEM), serving to minimize image distortion due to mask heating by intensified EUV radiation. Thus, the material layer 310 is also referred to as an LTEM layer 310 or an LTEM substrate 310. The LTEM layer 310 may include fused silica, fused quartz, calcium fluoride (CaF$_2$), silicon carbide, silicon oxide-titanium oxide alloy and/or other suitable low thermal expansion material.

The reflective multilayer (ML) 320 is disposed over the LTEM layer 310. The ML 320 includes a plurality of film pairs, such as molybdenum-silicon (Mo/Si) film pairs (e.g., a layer of molybdenum above or below a layer of silicon in each film pair). Alternatively, the ML 320 may include molybdenum-beryllium (Mo/Be) film pairs, or any two materials or two material combinations with large difference in refractive indices and small extinction coefficients. The thickness of each layer of the ML 320 depends on the wavelength and an incident angle of the EUV radiation 104. For a specified incident angle, the thickness of each layer of the ML 320 may be adjusted to achieve maximal constructive interference for radiations reflected at different interfaces of the ML 320. A typical number of film pairs are 20-80, however any number of film pairs are possible. In an embodiment, the ML 320 includes 40 pairs of layers of Mo/Si. Each Mo/Si film pair has a thickness of about 7 nm, e.g., about 3 nm for Mo and about 4 nm for Si. In this case, a reflectivity of about 70% is achieved.

The patterned ML 370 is disposed over the reflective ML 320. The patterned ML 370 also includes a plurality of film pairs, such as molybdenum-silicon (Mo/Si) film pairs, molybdenum-beryllium (Mo/Bc) film pairs, or any two materials or two material combinations with large difference in refractive indices and small extinction coefficients. In an embodiment, the patterned ML 370 includes the same material as the ML 320, but with a smaller number of film pairs than in the ML 320. In another embodiment, the patterned ML 370 includes different materials than the ML 320. For example, the patterned ML 370 may include Mo/Si film pairs while the ML 320 includes Mo/Be film pairs or vice versa.

As shown in FIG. 2, the patterned ML 370 includes ridges 374 separated by trenches 372. The ridges 374 are also referred to as ML patterns 374. The radiation beam 104 is reflected by both the ML patterns 374 and the ML 320 through the trenches 372. For negative tone mask and wafer patterning process, the ridges 374 correspond to the lines 108a in FIG. 1B or the islands 108c in FIG. 1C, and the trenches 372 correspond to the spaces 108b in FIG. 1B or the spacing row/columns 108d in FIG. 1C. For positive tone mask and wafer patterning process, the trenches 372 correspond to the lines 108a in FIG. 1B or the islands 108c in FIG. 1C, and the ridges 374 correspond to the spaces 108b in FIG. 1B or the spacing row/columns 108d in FIG. 1C. The radiation beam 104 reflected by the ML patterns 374 and the radiation beam 104 reflected by the ML 320 have different phases. This phase difference creates contrast in a wafer image. Particularly, the phase difference is the largest when transitioning across the edges of the ML patterns 374. This is unlike a binary EUV mask with a patterned absorber where the patterned absorber absorbs, rather than reflects, the radiation beam 104. One advantage of the mask 108 of the present embodiment is that it absorbs less EUV energy and reflects more EUV energy than binary EUV masks. Thus, more EUV energy is reflected towards the resist layer on the wafer 116 (FIG. 1A) for increased WPH throughput by using the mask 108 than using a binary EUV mask. Also, since the mask 108 absorbs less EUV energy than binary EUV masks, it generates less heat and can work longer lifetime than binary EUV masks.

In some embodiments, the width W1 of the trenches 372 depends on the target IC layout design and may be in a range of about 20 nm to about 120 nm, such as from about 40 nm to about 90 nm. In some embodiments, the thickness H1 of the ML 370 (H1 is also the height of the ML patterns 374 or the depth of the trenches 372) is tuned based on the width W1 to achieve certain imaging quality, such as measured by imaging contrast and/or ILS. For example, when W1 is in the range of 50 nm to 90 nm, the H1 may be tuned in a range of about 20 nm to about 160 nm, such as from about 60 nm to about 120 nm. When H1 is outside of the above range(s), the mask 108 may not achieve an acceptable imaging contrast and/or ILS. As discussed above, the H1 may vary a few nanometers among the trenches 327 (such as +/−2 nm or +/−3 nm) and still achieve acceptable wafer image CD variation. This relaxes the trench etching requirements and is yet another advantage of the present disclosure.

Figure 3:
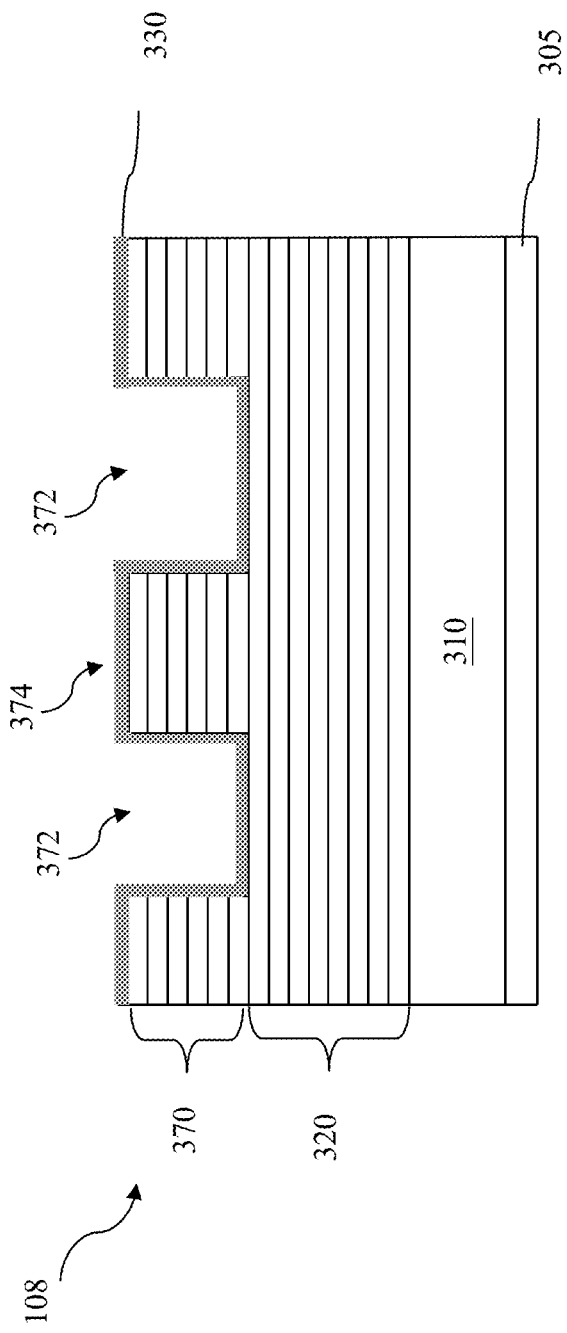

FIG. 3 illustrates a cross-sectional view of the mask 108 according to another embodiment, which is the same as the embodiment in FIG. 2 with the addition of a capping layer 330. The capping layer 330 is also referred to as a protective layer 330. The capping layer 330 is disposed over top surfaces and sidewall surfaces of the ML patterns 374 as well as top surfaces of the ML 320 that are exposed in the trenches 372. The capping layer 330 may protect the ML 320 and ML patterns 374 from oxidation when the mask 108 is in a cleaning process, thereby enhancing the cleaning durability of the mask 108. The capping layer 330 may also improve the mask 108's durability against EUV radiation. In an embodiment, the capping layer 330 is deposited to have a substantially uniform thickness on the various surfaces of the ML 320 and ML patterns 374. In some embodiments, the thickness of the capping layer 330 is in a range of about 1 nm to about 5 nm, such as about 2 nm to about 5 nm or about 2 nm to about 3 nm. If the capping 330 is thinner than this range (for example, thinner than 1 nm), it generally does not provide enough protection to the ML 320 and ML patterns 374. If the capping 330 is thicker than this range (for example, thicker than 5 nm), then its negative impact on the optical imaging and WHP throughput will be noticeable. When the thickness of the capping layer 330 is within the disclosed ranges above, its impact on the optical imaging and WHP throughput is about-1% to about-2% as confirmed by 3D optical simulation, which is generally acceptable considering the protection it offers. In the present embodiment, the capping layer 330 includes a material with low k (extinction coefficient) such as ruthenium (Ru), silicon (Si), silicon carbide (SiC), a combination thereof (for example, a layer of Ru over a layer of Si), or other suitable materials. In various embodiments, the capping layer 330 may be deposited using ALD, CVD, or other suitable methods.

Figure 4:
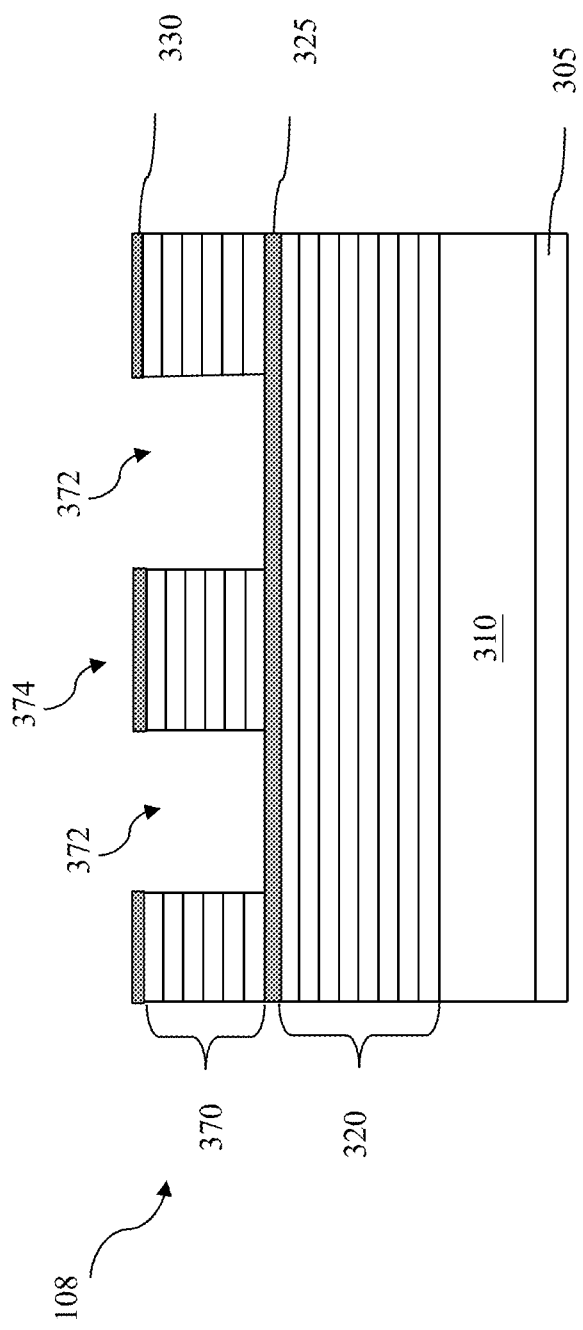

FIG. 4 illustrates a cross-sectional view of the mask 108 according to yet another embodiment, which is similar to the embodiment in FIG. 2 and with additional features. As illustrated, the mask 108 includes the ML 320 and the patterned ML 370. The mask 108 further includes an etch stop layer 325 and a capping layer 330. The etch stop layer 325 is disposed between the ML 320 and the patterned ML 370. Particularly, the trenches 372 expose the etch stop layer 325 and do not expose the ML 320. The capping layer 330 is disposed on the top surface of the ML patterns 374. In the present embodiment, the capping layer 330 is not disposed on the sidewall surfaces of the ML patterns 374. The etch stop layer 325 has different etching characteristics from the ML 370 and acts as an etching stop layer in a patterning or repairing process of the ML 370. In the present embodiment, the etch stop layer 325 includes a material with low k (extinction coefficient) such as ruthenium (Ru), silicon (Si), silicon carbide (SiC), a combination thereof, or other suitable materials. In an embodiment, the etch stop layer 325 may have a thickness in the range of about 1 nm to about 8 nm, such as about 2 nm to about 5 nm. In an embodiment, the etch stop layer 325 includes a layer of Ru over a layer of Si. The layer of Ru may have a thickness about 2 nm to 4 nm, such as 3.5 nm. The layer of Si may have a thickness about 2 nm to 4 nm, such as 3.5 nm. The thickness of the layer 325 is designed to achieve its etching stop function, yet without too much negative impact on imaging quality. If the layer 325 is thinner than the above range (for example, thinner than 1 nm), it generally does not provide the intended etching stop function. If the layer 325 is thicker than the above range (for example, thicker than 8 nm), then its negative impact on the optical imaging and WHP throughput will be noticeable. The capping layer 330 may have a composition and thickness as discussed above with reference to FIG. 3. When the thicknesses of the layers 325 and 330 are within the disclosed ranges above, their impact on the optical imaging and WHP throughput is about-1% to about-2% as confirmed by 3D optical simulation, which is generally acceptable considering the functions they provide.

Each of the layers 305, 310, 320, 370, 325, and 330 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), atomic layer deposition (ALD), ion beam deposition, and/or other methods.

Experiments and simulation have shown that the FR-PEM mask 108 (such as the embodiments shown in FIGS. 2, 3, and 4) enables much higher WPH throughput than binary masks with equivalent imaging performance. In an experiment, a dipole illumination source (such as the dipole illumination source 102 in FIG. 1B) is used for creating a target line/space pattern with a pitch 25 nm (for example, line width 12.5 nm and space width 12.5 nm). The source pupil is optimized to Iso-Focal condition of 2-beam interference:

$$\sigma = \frac{\lambda}{2P_{wafer}NA} = \frac{1}{4k_1}$$

K1=0.306
Sigma at 0.818
Radius=0.1
With equivalent imaging quality as measured by imaging contrast, ILS, NILS, and DoF, a required EUV energy dose using a binary EUV mask is about 2.569 times more than a required EUV energy dose using the FR-PEM 108. In other words, using the FR-PEM 108 speeds up the WPH throughput by a factor of 2.569 than using a binary EUV mask. Further, the FR-PEM 108 offers higher error tolerance than the binary EUV mask as evidenced by about 2× reduction in scan slit center-edge ΔCD and about 4× to 5× reduction in MEEF (Mask Error Enhancement Factor).

In another experiment, a quadrupole illumination source (such as the quadrupole illumination source 102 in FIG. 1C) is used for creating a target 2-dimensional hole/array pattern with a pitch 25 nm (for example, island width 12.5 nm and space width 12.5 nm). The source pupil is optimized to Iso-Focal condition of 2-beam interference:

$$\sigma = \frac{\lambda}{2P_{wafer}NA} = \frac{1}{4k_1}$$

K1=0.306
Sigma at 0.818
Radius=0.1
With equivalent imaging quality as measured by imaging contrast, ILS, NILS, and DoF, a required EUV energy dose using a binary EUV mask is about 1.83 times more than a required EUV energy dose using the FR-PEM 108. In other words, using the FR-PEM 108 speeds up the WPH throughput by a factor of 1.83 than using a binary EUV mask. Similar to the first experiment, the FR-PEM 108 offers higher error tolerance than the binary EUV mask as evidenced by about 2× reduction in scan slit center-edge ΔCD and about 4× to 5× reduction in MEEF.

In yet another experiment, a hexapole illumination source (such as the hexapole illumination source 102 in FIG. 1D) is used for creating target patterns with pitches of 25 nm, 37 nm, and 50 nm. The source pupil is optimized to Iso-Focal condition:

$$\sigma = \frac{\lambda}{2P_{wafer}NA} = \frac{1}{4k_1}$$

K1=0.306
Sigma at 0.818
Radius=0.1
With equivalent imaging quality as measured by imaging contrast, ILS, NILS, and DoF, a required EUV energy dose using a binary EUV mask is about 2.27 times more than a required EUV energy dose using the FR-PEM 108. In other words, using the FR-PEM 108 speeds up the WPH throughput by a factor of 2.27 than using a binary EUV mask. Similar to the first two experiments, the FR-PEM 108 generally offers higher error tolerance than the binary EUV mask.

A system (such as the system 100) using the FR-PEM 108 can be tuned to concurrently optimize both the imaging quality and higher WPH throughput. For example, with the dipole illumination source and the quadrupole illumination source as discussed above, experiments have shown about 1.3× to about 1.5×WPH throughput improvement with better imaging quality using the FR-PEM 108 than using a binary EUV mask. Similar results have been observed using hexapole illumination source.

Figure 5:
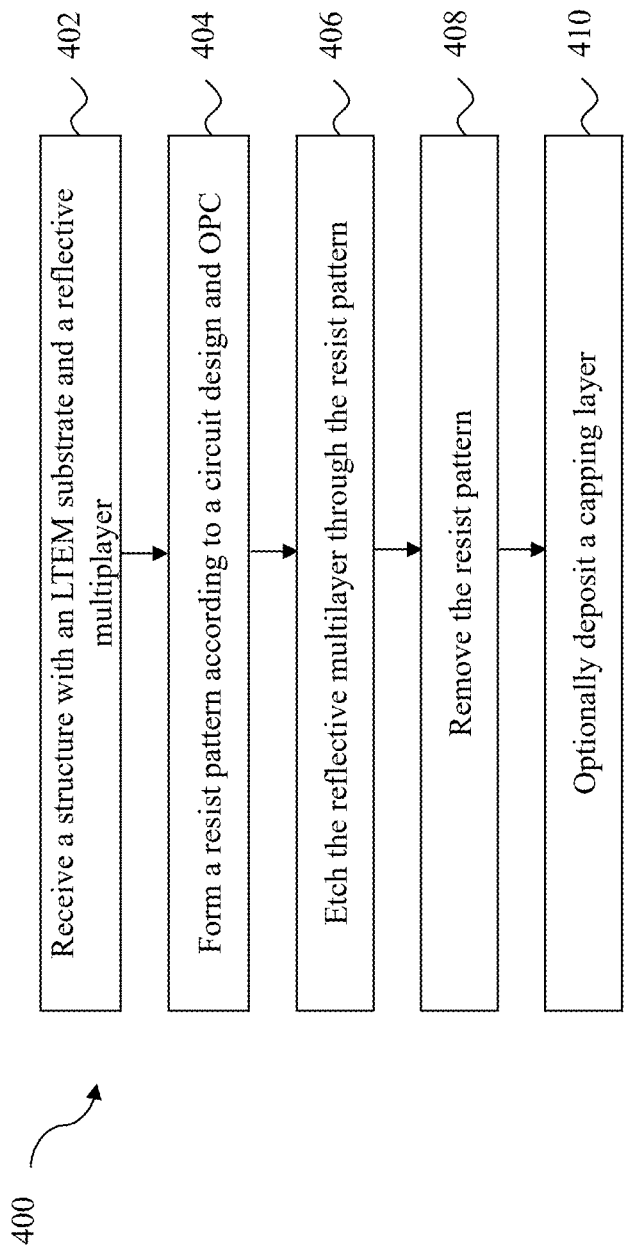
FIG. 5 illustrates a flow chart of a method of making an EUV mask, according to an embodiment of the present disclosure.

FIG. 5 illustrates a method 400 of forming an FR-PEM mask 108, particularly the embodiments of the mask 108 shown in FIGS. 2 and 3. The method 400 is described below in conjunction with FIGS. 6A-6E.

Figure 6B:
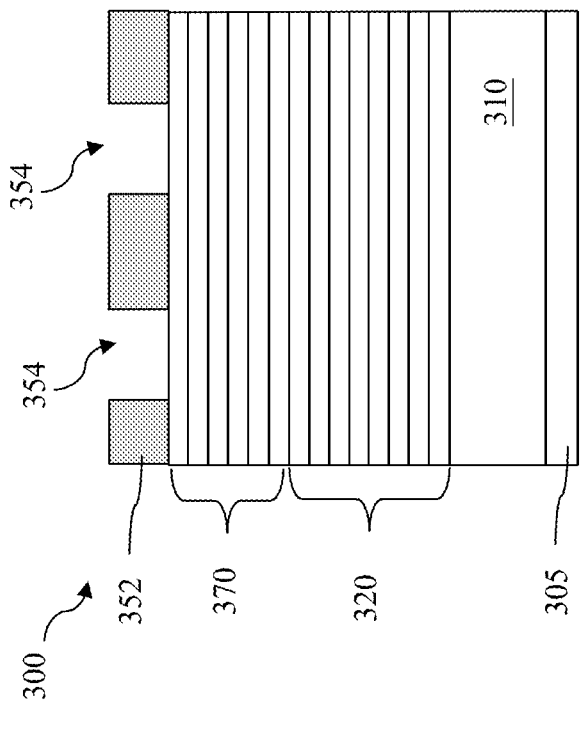
FIGS. 6A, 6B, 6C, 6D, and 6E illustrate cross-sectional views of an embodiment of an EUV mask at various fabrication steps according to the method in FIG. 5.
Figure 6A:
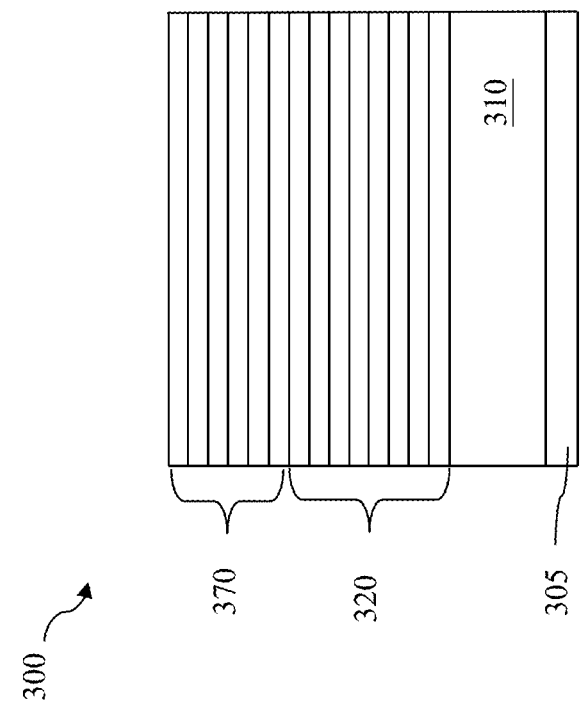

At operation 402, the method 400 (FIG. 5) receives a structure 300 as shown in FIG. 6A. The structure 300 includes an LTEM substrate 310, an ML 320 disposed over the LTEM 310, and an ML 370 disposed over the ML 320. The structure 300 further includes a conductive layer 305 disposed under the LTEM substrate 310. The composition of the layers 305, 310, 320, and 370 have been discussed with reference to FIG. 2 above. Particularly, the ML 320 and ML 370 may include the same materials or different materials in various embodiments.

At operation 404, the method 400 (FIG. 5) forms a resist pattern (or a patterned resist) 352 over the ML 370, such as shown in FIG. 6B. The resist pattern 352 provides openings 354 that expose the ML 370. In an embodiment, the operation 402 includes resist coating (e.g., spin-on coating), soft baking, exposure, post-exposure baking, developing the resist, rinsing, drying (e.g., hard baking), other suitable processes, and/or combinations thereof. The exposure is accomplished by electron beam direct writing, multiple electron beam direct writing, or using an optical writer. The e-beam writing process may be implemented in a raster scan mode or a vector scan mode. The e-beam may be Gaussian beam or shaped beam.

Figure 7B:
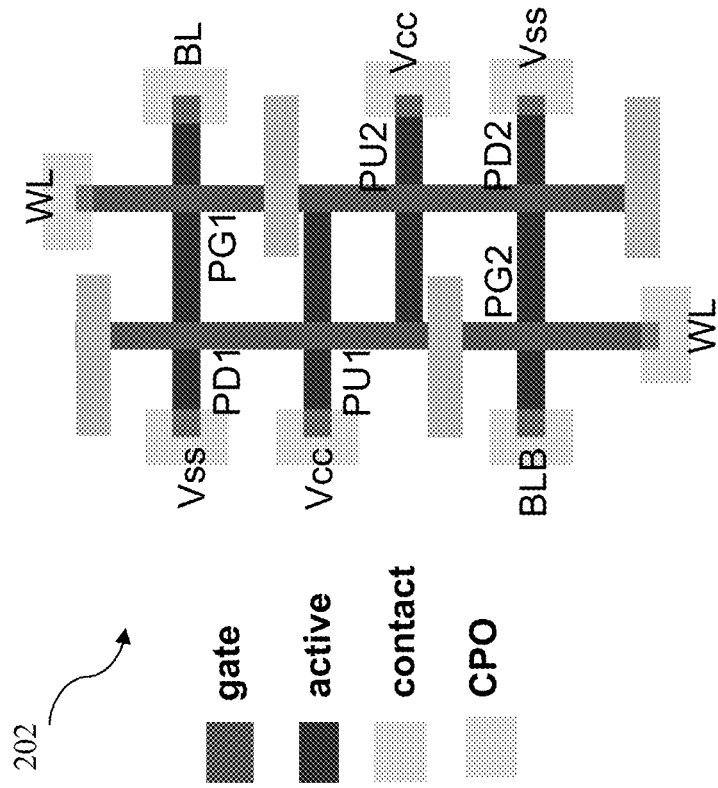
FIGS. 7A, 7B, 7C, and 7D illustrate a circuit design that is implemented onto an EUV mask according to an embodiment of the present disclosure.
Figure 7A:
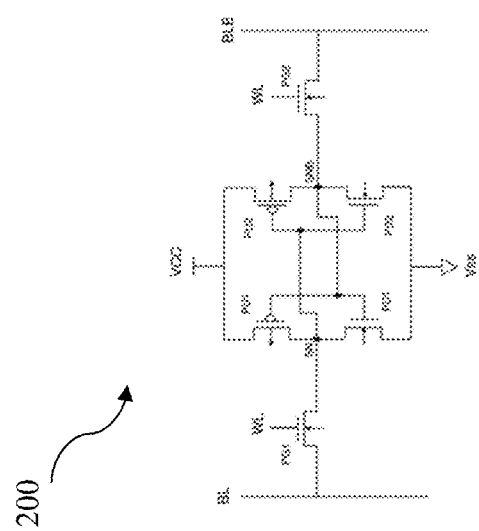
Figure 7D:
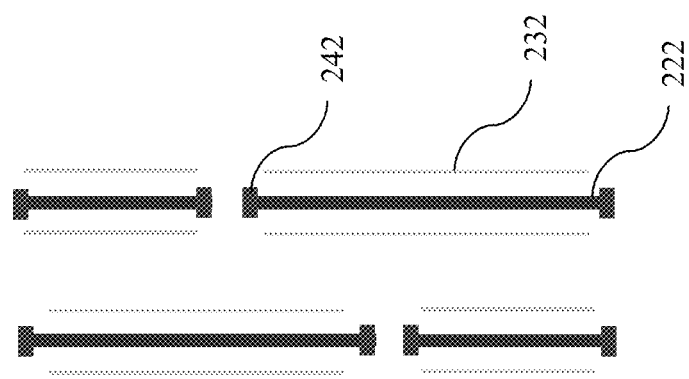
Figure 7C:
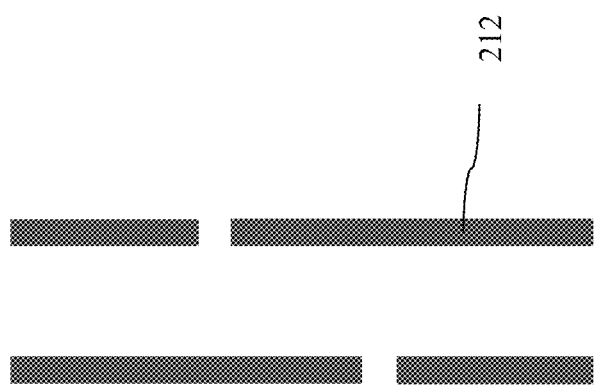

The resist pattern 352 may correspond to one of layers in an IC design layout. For example, an IC may include static random access memory (SRAM) and/or logic circuits, passive components such as resistors, capacitors, and inductors, and active components such as p-type FETs (PFETs), n-type FETs (NFETs), FinFETs, nanowire FETs, nanosheet FETs, metal-oxide semiconductor field effect transistors (MOSFET), complementary metal-oxide semiconductor (CMOS) transistors, bipolar transistors, high voltage transistors, high frequency transistors, other memory cells, and combinations thereof. FIG. 7A illustrates a schematic view of an IC 200 that includes a SRAM cell having 6 transistors (i.e., a 6T SRAM). An IC design layout includes various geometrical patterns designed for the IC (such as the IC 200). The geometrical patterns correspond to patterns of metal, oxide, or semiconductor layers that make up the various components of the IC. For example, a portion of an IC design layout may include geometrical features for active regions, gate electrodes, sources and drains, metal lines or vias of an interlayer interconnection, openings for bonding pads, and so on. An IC design layout is generally presented in one or more data files having information of the geometrical patterns, such as a GDSII file or DFII file. An IC design layout includes multiple layers of patterns with each layer to be patterned onto a mask, such as the mask 108. An example IC layout 202 is shown in FIG. 7B, which includes geometrical patterns for gates (vertical long bars), active regions (horizontal long bars), contacts (including Vss, Vcc, BL, BLB, WL), and cut patterns CPO. The layout 202 in FIG. 7B corresponds to the IC design 200 in FIG. 7A. FIG. 7C shows geometrical patterns 212 for the gates in FIG. 7B. FIG. 7D shows the geometrical patterns for the gates after resolution enhancement, for example, to address optical proximity effects (OPC). For example, the gate patterns now include main patterns 222 with enlarged end portions 242 and sub-resolution side-bar patterns 232. In an embodiment, the patterns 222, 242, and 232 are transferred to the resist pattern 352.

Figure 6D:
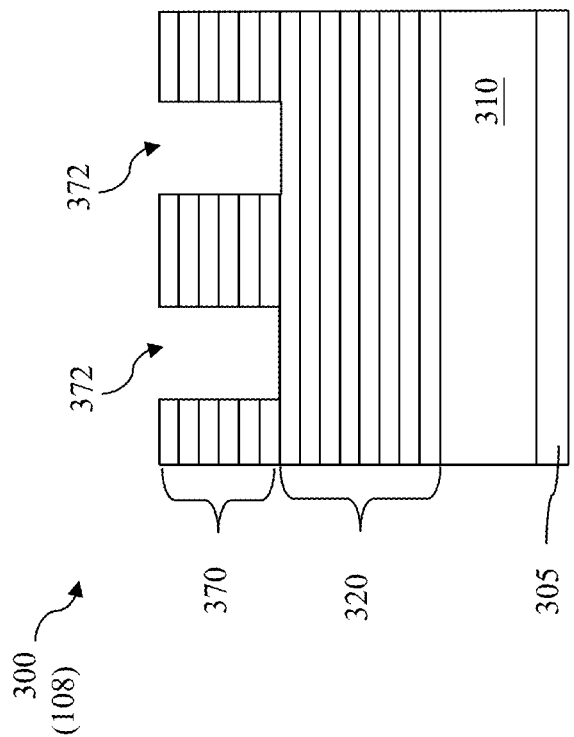
Figure 6C:
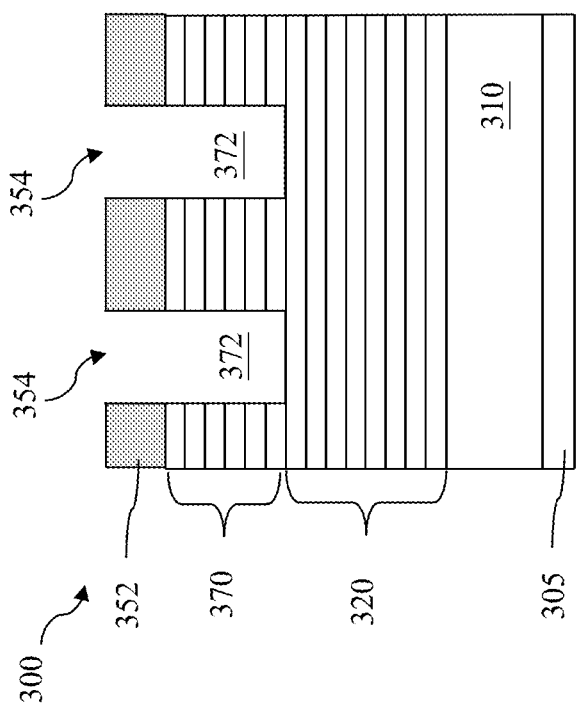

At operation 406, the method 400 (FIG. 5) etches the ML 370 using an etching process, thereby forming the trenches 372 such as shown in FIG. 6C. The etching process may include dry (plasma) etching, wet etching, and/or other etching methods. In an embodiment where the ML 370 and the ML 320 include different materials, the ML 320 may be used as an etch stop layer to determine when the etching is stopped. In such embodiment, the depth of the trench 372 is determined by the thickness of the ML 370. In another embodiment where the ML 370 and the ML 320 include the same material, a timer may be used to determine when to stop the etching based on a target trench depth as discussed above.

At operation 408, the method 400 (FIG. 5) removes the resist pattern 352, for example, by resist stripping. The resultant structure 300 is shown in FIG. 6D, which becomes an embodiment of the mask 108 as discussed above with reference to FIG. 2. The operation 408 may perform additional cleaning processes to the structure 300.

Figure 6E:
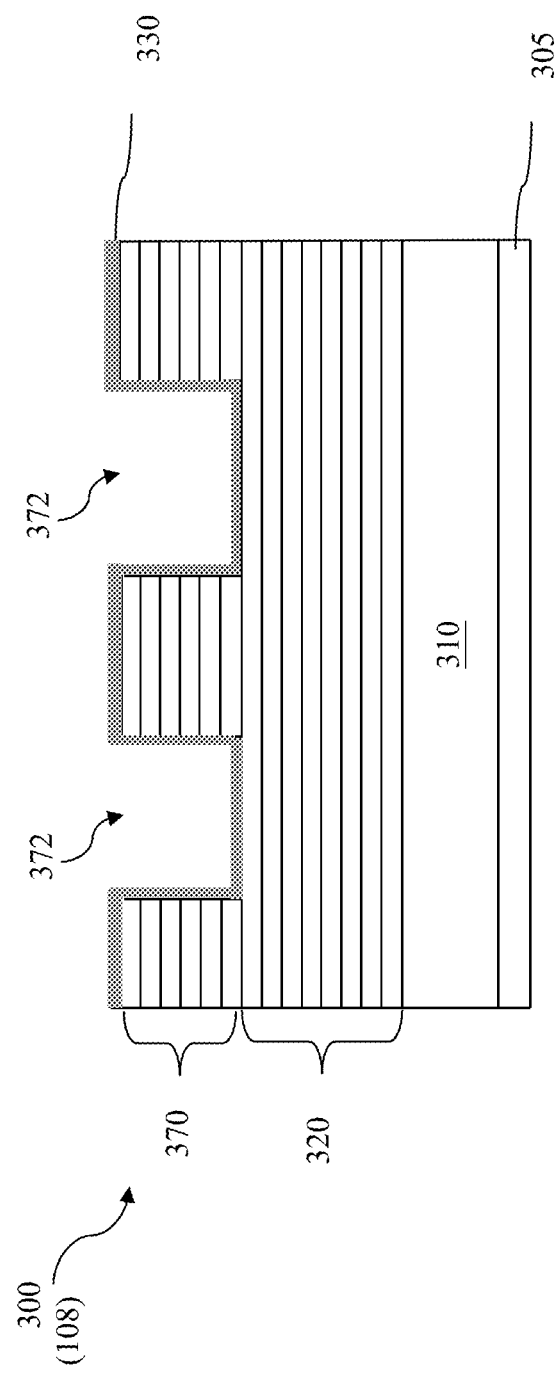

At operation 410, the method 400 (FIG. 5) deposits the capping layer 330 over the ML 320 and the ML 370, such as shown in FIG. 6E. The composition and thickness of the capping layer 330 have been discussed above with reference to FIG. 3. Particularly, the capping layer 330 is deposited to a substantially uniform thickness along the various surfaces in the present embodiment. The capping layer 330 may be deposited using ALD, CVD, or other suitable methods. This results in an embodiment of the mask 108 as discussed above with reference to FIG. 3. In some embodiment of the method 400, the operation 410 is optional and can be omitted.

Figure 8:
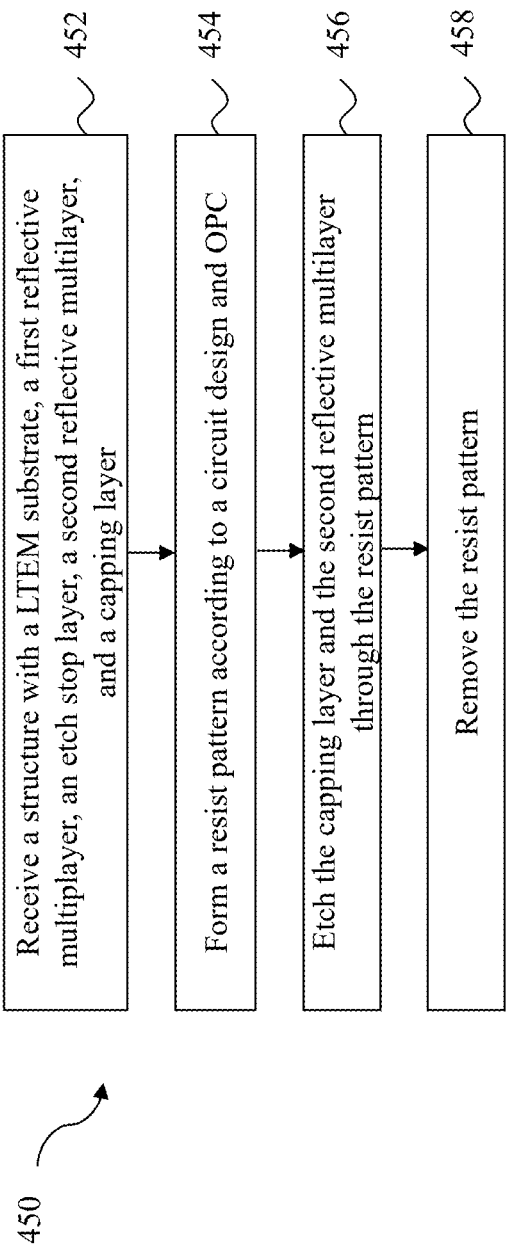
FIG. 8 illustrates a flow chart of a method of making an EUV mask, according to another embodiment of the present disclosure.

FIG. 8 illustrates a method 450 of forming an FR-PEM mask 108, particularly the embodiment of the mask 108 shown in FIG. 4. The method 450 is described below in conjunction with FIGS. 9A-9D.

Figures 9A, 9B:
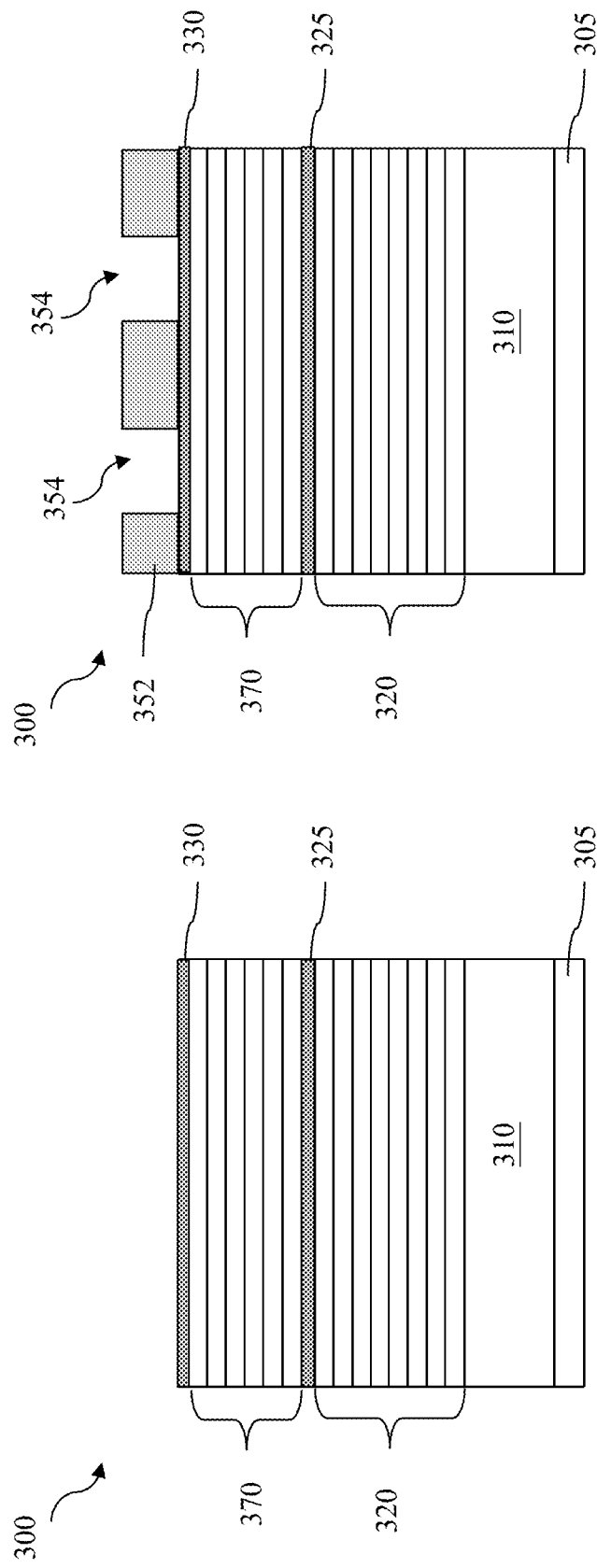
FIGS. 9A, 9B, 9C, and 9D illustrate cross-sectional views of an embodiment of an EUV mask at various fabrication steps according to the method in FIG. 8.

At operation 452, the method 450 (FIG. 8) receives a structure 300 as shown in FIG. 9A. The structure 300 includes an LTEM substrate 310, an ML 320 disposed over the LTEM 310, an etch stop layer 325 disposed over the ML 320, an ML 370 disposed over the etch stop layer 325, and a capping layer 330 disposed over the ML 370. The structure 300 further includes a conductive layer 305 disposed under the LTEM substrate 310. The composition of the layers 305, 310, 320, 325, 370, and 330 have been discussed above with reference to FIG. 4. For example, the ML 320 and ML 370 may include the same materials or different materials in various embodiments.

At operation 454, the method 450 (FIG. 8) forms a resist pattern (or a patterned resist) 352 over the capping layer 330, such as shown in FIG. 9B. This operation may be the same as or similar to the operation 404 discussed above.

Figure 9D:
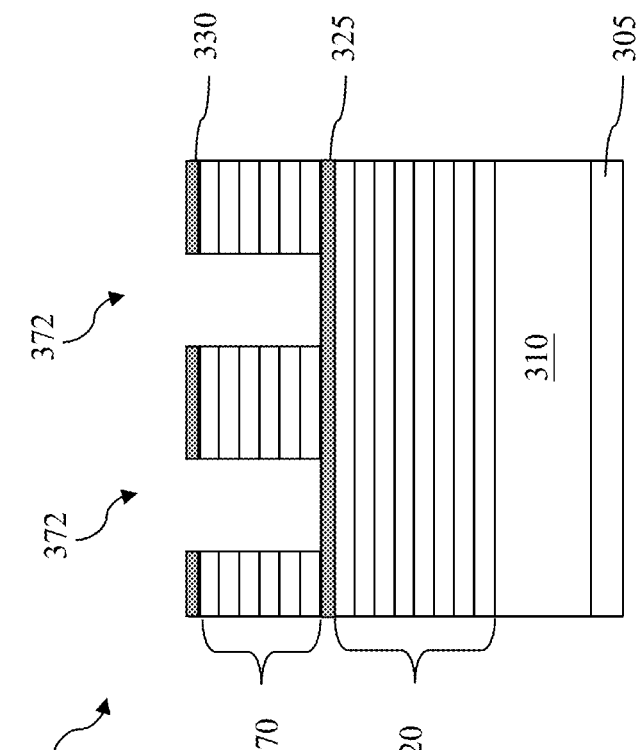
Figure 9C:
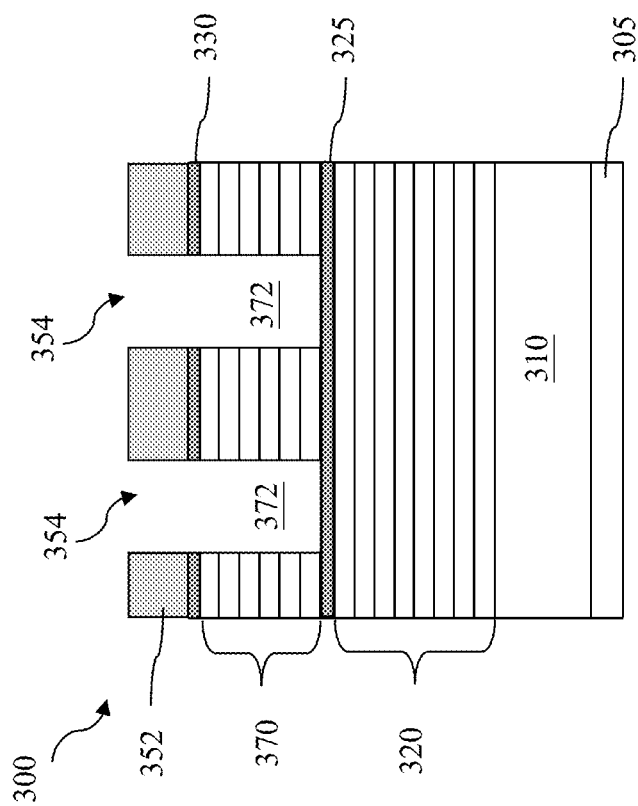

At operation 456, the method 450 (FIG. 8) etches the capping layer 330 and the ML 370 using an etching process, thereby forming the trenches 372 such as shown in FIG. 9C. The etching process may include dry (plasma) etching, wet etching, and/or other etching methods. In an embodiment, the etching process is tuned selective to the materials of the capping layer 330 and the ML 370, with no (or minimal) etching to the etch stop layer 325. The etch stop layer 325 is used to determine when to stop the etching. By using the etch stop layer 325, accurate control over the depth of the trenches 372 can be achieved.

At operation 458, the method 450 (FIG. 8) removes the resist pattern 352, for example, by resist stripping. The resultant structure 300 is shown in FIG. 9D, which becomes an embodiment of the mask 108 as discussed above with reference to FIG. 4. The operation 458 may perform additional cleaning processes to the structure 300.

Figure 10:
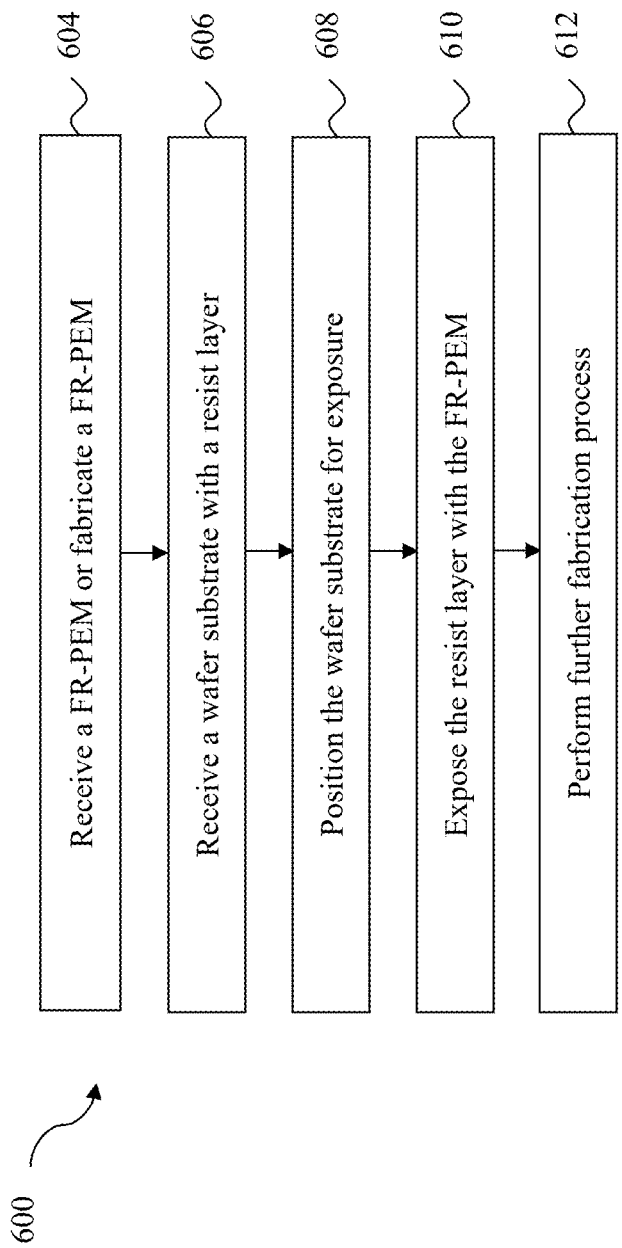
FIG. 10 is a flowchart illustrating a method of exposing a semiconductor wafer for fabricating ICs according to various aspects of the present disclosure.

FIG. 10 is a flow chart of a method 600 of exposing a semiconductor wafer using photolithography according to various aspects of the present disclosure. The method 600 may be implemented, in whole or in part, by a EUV lithography system, such as the system 100.

The method 600 (FIG. 10) begins at operation 604 where a FR-PEM mask 108 is received or fabricated. Some embodiments of the mask 108 are shown in FIGS. 2, 3, and 4 above. The mask 108 may be fabricated using embodiments of the methods 400 or 450 shown in FIGS. 5 and 8 discussed above. The mask 108 may be provided by the same manufacturer that utilizes the mask 108 to fabricate integrated circuit devices. Alternatively, the mask 108 may be received from a vendor, which may be a third party.

Figure 11:
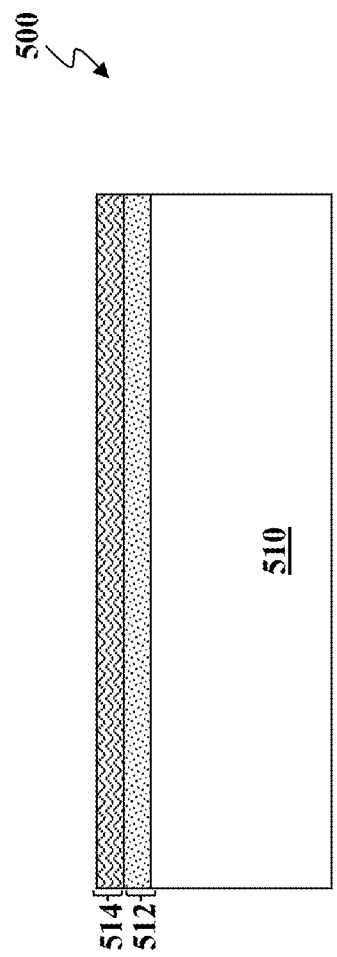
FIG. 11 illustrates a cross sectional view of an embodiment of a semiconductor wafer according to various aspects of the present disclosure.

The method 600 (FIG. 10) proceeds to operation 606 where a wafer is received or provided, and the wafer includes a substrate and a photoresist (or resist) layer formed over the substrate. Referring to FIG. 11, a diagrammatic cross-sectional side view of a wafer 500 (such as a semiconductor wafer) is illustrated. The wafer 500 has been simplified for the sake of clarity to better understand the inventive concepts of the present disclosure. Additional features can be added in the wafer 500, and some of the features described below can be replaced or eliminated in other embodiments of the wafer 500.

Referring to FIG. 11, the wafer 500 includes a substrate 510. The substrate 510, for example, can be a bulk substrate or a semiconductor-on-insulator (SOI) substrate. The substrate 510 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. A SOI substrate can be fabricated using separation by implantation of oxygen (SIMOX), wafer bonding, and/or other suitable methods. The substrate 510 may be a p-type substrate, an n-type substrate, or a combination thereof. Although the present disclosure provides various examples of a substrate, the scope of the disclosure and claims should not be limited to the specific examples unless expressly claimed.

Still referring to FIG. 11, the substrate 510 includes one or more layers 512 to be patterned. The layers may be, for example, dielectric layers, non-dielectric layers, metal layers, etc. The one or more layers 512 may be formed by chemical vapor deposition (CVD), physical vapor deposition (PVD), atomic layer deposition (ALD), high density plasma CVD (HDPCVD), plating, other suitable methods, and/or combinations thereof. Formed over the layers 512 is a resist layer 514. The resist layer 514 includes a material sensitive to EUV processing. The resist layer 514 may be formed by a spin coating process or any suitable process. Other steps may be further implemented after the coating of the resist layer 514. For example, a baking process may be applied to the resist layer 514 to partially drive out solvents (used in the spin coating process) from the resist layer 514.

The method 600 (FIG. 10) proceeds to operation 608 where the wafer 500 is positioned on a stage, such as the stage 114 (FIG. 1), to take EUV exposure with the FR-PEM EUV mask 108. In an embodiment, either the wafer 500, or the mask 108, or both of them may be moved and aligned during the EUV exposure process in a EUV lithography system, such as the system 100 (FIG. 1). After the wafer 500 and the mask 108 are positioned properly, the method 600 (FIG. 10) proceeds to operation 610 to expose the wafer 500 with a dose of the EUV radiation beam 104. As discussed above, one of the benefits of using the FR-PEM 108 is that the dose of the EUV radiation beam 104 can be reduced compared to using a binary EUV mask, thereby the wafer per hour throughput is increased.

After the resist 514 has been exposed, the method 600 (FIG. 10) proceeds to operation 612 to further operations in forming the IC device. For example, the further operations may include developing the resist layer 514 and removing portions of the resist layer that are exposed to the EUV radiation beam 104 (or unexposed, depending on the type of the resist layer 514), etching the one or more layers 512 with the patterned resist layer 514 as an etch mask, forming circuit structures in the substrate 510, and so on.

Although not intended to be limiting, one or more embodiments of the present disclosure provide many benefits to a semiconductor device and the formation thereof. For example, embodiments of the present disclosure provide a novel EUV mask, a fully reflective phase edge mask (or FR-PEM), for use in EUV lithography. A FR-PEM provides better wafer per hour (WPH) throughput than a binary EUV mask with equivalent or better imaging quality. This enables concurrent optimization of WPH throughput and EUV lithographic imaging performance. Embodiments of the present disclosure also provide methods of making a FR-PEM and systems and methods for using a FR-PEM for semiconductor fabrication.

In one example aspect, the present disclosure is directed to a EUV lithography mask that includes a substrate of a low thermal expansion material; a first reflective multilayer over the substrate; and a patterned reflective multilayer over the first reflective multilayer. The patterned reflective multilayer includes trenches through the patterned reflective multilayer, and each of the first reflective multilayer and the patterned reflective multilayer includes a stack of film pairs.

In an embodiment, the EUV lithography mask further includes an etch stop layer disposed between the first reflective multilayer and the patterned reflective multilayer. In another embodiment, the EUV lithography mask further includes a capping layer disposed on top surfaces of the patterned reflective multilayer. In yet another embodiment, the EUV lithography mask further includes a capping layer disposed on top surfaces and sidewall surfaces of the patterned reflective multilayer and on top surfaces of the first reflective multilayer that are exposed by the trenches.

In some embodiments of the EUV lithography mask, the stack of film pairs includes molybdenum and silicon film pairs. In some embodiments, the patterned reflective multilayer includes line patterns alternating with the trenches. In some embodiments, a first subset of the trenches is oriented along a first direction and a second subset of the trenches is oriented along a second direction generally perpendicular to the first direction. In some embodiments, the EUV lithography mask further includes a conductive layer disposed under the substrate.

In another example aspect, the present disclosure is directed to a method of making a EUV lithography mask. The method includes receiving a structure having a substrate of a low thermal expansion material, a first reflective multilayer over the substrate, an etch stop layer over the first reflective multilayer, a second reflective multilayer over the etch stop layer, and a capping layer over the second reflective multilayer. The method further includes forming a patterned resist over the capping layer; etching the capping layer and the second reflective multilayer through the patterned resist until the etch stop layer is exposed; and removing the patterned resist.

In some embodiments of the method, the second reflective multilayer has a thickness in a range from about 60 nm to about 120 nm. In some embodiments, each of the first reflective multilayer and the second reflective multilayer includes a stack of alternating molybdenum and silicon pairs. In some embodiments, the capping layer includes Ru, Si, SiC, or a combination thereof. In an embodiment, the etch stop layer includes Ru, Si, SiC, or a combination thereof. In another embodiment, the structure further includes a conductive layer disposed under the substrate.

In yet another example aspect, the present disclosure is directed to a method of making a EUV lithography mask. The method includes receiving a structure having a substrate of a low thermal expansion material and a reflective multilayer over the substrate; forming a patterned resist over the reflective multilayer; etching the reflective multilayer through the patterned resist to form trenches of a first depth without completely etching through the reflective multilayer; and removing the patterned resist.

In an embodiment of the method, the first depth is in a range of 60 nm to 120 nm. In another embodiment, the reflective multilayer includes a stack of alternating molybdenum and silicon pairs.

In an embodiment, the method further includes depositing a capping layer over top surfaces of the reflective multilayer and sidewall and bottom surfaces of the trenches. In a further embodiment, the capping layer has a thickness about 2 nm to 5 nm over the top surfaces of the reflective multilayer and the sidewall and bottom surfaces of the trenches. In some embodiments of the method, the capping layer includes Ru, Si, SiC, or a combination thereof.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a structure having a substrate of a low thermal expansion material, a first reflective multilayer over the substrate, a silicon carbide layer over the first reflective multilayer, and a second reflective multilayer over and in direct contact with the silicon carbide layer, and a capping layer directly on the second reflective multilayer;
    forming a patterned resist over the second reflective multilayer;
    etching a first portion of the second reflective multilayer through the patterned resist until the silicon carbide layer is exposed, while maintaining a second portion of the second reflective multilayer over the silicon carbide layer, thereby forming a first trench in the second reflective multilayer, a first ridge and a second ridge disposed on each side of the first trench, wherein a first edge of the first ridge and second edge of the second ridge define respective sidewalls of the first trench and correspond to patterns of line/space patterns of one or more target integrated circuit devices, wherein the first ridge includes a first top surface extending from the first edge to a third edge and wherein the second ridge includes a second top surface extending from the second edge to a fourth edge; and
    removing the patterned resist;
    wherein after removing the patterned resist, the capping layer extends on an entirety of the first top surface of the first ridge extending from the first edge to the third edge and an entirety of the second top surface of the second ridge extending from the second edge to the fourth edge, wherein an entirety of an upper surface of the capping layer is free from absorption material and forms an uppermost surface of an EUV lithography mask; and
    providing a dipole illumination source to create the line/space patterns on a semiconductor substrate, wherein the dipole illumination source is optimized to iso-focal condition of 2-beam interference for the line/space pattern and the dipole illumination source defined by a sigma of partial coherence of approximately 0.8.

2. The method of claim 1, wherein each of the first reflective multilayer includes a stack of alternating molybdenum and silicon pairs providing a reflectivity of approximately 70%, and the second reflective multilayer includes a stack of alternating molybdenum and beryllium pairs.

3. A method of EUV lithography, comprising:
    receiving a structure having a substrate of a low thermal expansion material and a first reflective multilayer in direct contact with the substrate, wherein the first reflective multilayer consists of a stack of two alternating films of different materials;
    forming a stop layer across a top surface of the first reflective multilayer, wherein the stop layer is disposed directly touching a first film of the two alternating films;
    forming a second reflective multilayer over the stop layer, wherein the second reflective multilayer consists of a stack of two alternating films of different material
    forming a patterned resist over the second reflective multilayer;
    forming a protective layer over the second reflective multilayer;
    forming a patterned resist over the protective layer and the second reflective multilayer;
    etching the second reflective multilayer through the patterned resist to form a plurality of trenches of a first depth exposing an upper surface of the stop layer to provide a bottom surface of each trench at the first depth and form ridges of the second reflective multilayer extending between each trench of the plurality of trenches, the ridges each having at least two sidewalls extending from a top surface of the ridge to a top surface of the protective layer, wherein the trenches correspond to a pattern of an integrated circuit device, wherein an entirety of the bottom surface of each of the trenches is the stop layer and wherein the stop layer extends under each of the ridges; and
    wherein the pattern of the integrated circuit device is one of a first pattern of a plurality of lines and spaces or a second pattern of a plurality of holes in an array;
    wherein after removing the patterned resist, an entirety of the top surface of each of the ridges has the protective layer extending between the at least two sidewalls of each of the ridges, an entirety of an upper surface of the protective layer being exposed;
    providing a radiation beam to the structure including to the bottom surface of each trench and each of the ridges having the exposed upper surface of the protective layer, wherein the radiation beam is delivered from a source pupil having a sigma of approximately 0.8, and wherein the radiation beam is a dipole illumination source when the pattern is the first pattern and a quadrupole illumination source when the pattern is the second pattern; and
    reflecting a first portion of the radiation beam from the ridges and a second portion of the radiation beam from the trenches, wherein the reflected first portion and second portion differ in phase.

4. The method of claim 3, wherein the first depth is in a range of 60 nm to 120 nm.

5. The method of claim 3, wherein the two alternating films of the first reflective multilayer are molybdenum and silicon films.

6. The method of claim 3, wherein the stop layer includes SiC.

7. The method of claim 1, wherein the capping layer includes Ru, Si, SiC, or a combination thereof.

8. The method of claim 1, wherein the capping layer is silicon carbide.

9. The method of claim 1, wherein the first reflective multilayer has a reflectivity of about 70% and the capping layer has an impact of the reflectivity of about −1% to −2%.

10. The method of claim 5, wherein the two alternating films of the second reflective multilayer are molybdenum and beryllium films.

11. The method of claim 3, wherein the providing the radiation beam and reflecting the first portion includes a loss of 1 to 2% of the reflectivity from the second reflective multilayer for the first portion due to the protective layer and loss of 1 to 2% of the reflectivity from the first reflective multilayer due to the stop layer.

12. The method of claim 1, wherein the sigma is defined by $$6 = \frac{\lambda}{2 P_{wafer} NA}$$

wherein $\lambda$ is a wavelength of radiation from the dipole illumination source, NA is numerical aperture, and Pwafer is a pitch dimension of the line/space patterns.

13. The method of claim 12, wherein sigma is defined by $$6 = \frac{1}{4k1}$$

wherein k1 is a process parameter of approximately 0.3.

14. The method of claim 1, wherein the line/space patterns have a pitch of approximately 25 nm.

15. The method of claim 14, wherein the pitch includes a line width of 12.5 nm and a space width of 12.5 nm.

16. The method of claim 12, wherein the line/space patterns have a pitch having a line width approximately equal to a space width.

17. The method of claim 1, further comprising:
the first trench has a width between 50 nm to 90 nm and a height between 20 nm and 160 nm defining the line/space patterns.

18. The method of claim 3, further comprising:
selecting the dipole illumination source based on the first pattern of the plurality of lines and spaces having a pitch of approximately 25 nm.

19. The method of claim 3, further comprising:
selecting the quadrupole illumination source based on the second pattern of the plurality of holes in the array having a pitch of approximately 25 nm.

20. The method of claim 3, the plurality of trenches includes a width between 50 nm to 90 nm and a height between 20 nm and 160 nm.

* * * * *